(12) United States Patent
Hollis et al.

(10) Patent No.: US 9,077,305 B2
(45) Date of Patent: Jul. 7, 2015

(54) ADAPTIVE ON DIE DECOUPLING DEVICES AND METHODS

(71) Applicant: Micron Technology, Inc., Boise, ID (US)

(72) Inventors: Timothy M. Hollis, Poway, CA (US); Steven Bodily, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/153,580

(22) Filed: Jan. 13, 2014

(65) Prior Publication Data

US 2014/0125424 A1    May 8, 2014

Related U.S. Application Data

(63) Continuation of application No. 12/860,562, filed on Aug. 20, 2010, now Pat. No. 8,629,733.

(51) Int. Cl.
 *H03H 7/00* (2006.01)
 *H03H 7/01* (2006.01)
 *H01L 23/64* (2006.01)
 *H01L 49/02* (2006.01)

(52) U.S. Cl.
 CPC ........... *H03H 7/0138* (2013.01); *H01L 23/642* (2013.01); *H01L 28/20* (2013.01); *H01L 28/40* (2013.01); *H01L 2924/0002* (2013.01)

(58) Field of Classification Search
 CPC ............... H03H 7/0138; H01L 23/642; H01L 2924/0002; H01L 28/20; H01L 28/40
 USPC .......................................... 333/112, 181, 12
 See application file for complete search history.

(56) References Cited

U.S. PATENT DOCUMENTS

| | | | |
|---|---|---|---|
| 6,571,184 B2 | 5/2003 | Anderson et al. |
| 6,606,012 B2 | 8/2003 | Novak |
| 7,239,524 B2 | 7/2007 | Chung et al. |
| 7,595,973 B1 | 9/2009 | Lee et al. |
| 7,952,364 B2 | 5/2011 | Kim et al. |
| 8,228,680 B2 | 7/2012 | Myat et al. |
| 8,410,579 B2 | 4/2013 | Ghia et al. |
| 8,629,733 B2 | 1/2014 | Hollis et al. |
| 2007/0054420 A1 | 3/2007 | Lu et al. |
| 2008/0310078 A1 | 12/2008 | Lee et al. |
| 2009/0059469 A1 | 3/2009 | Lee et al. |
| 2012/0044028 A1 | 2/2012 | Hollis et al. |

*Primary Examiner* — Robert Pascal
*Assistant Examiner* — Kimberly Glenn
(74) *Attorney, Agent, or Firm* — Schwegman Lundberg & Woessner, P.A.

(57) ABSTRACT

Semiconductor dies and methods are described, such as those including a first capacitive pathway having a first effective series resistance (ESR) and a second capacitive pathway having an adjustable ESR. One such device provides for optimizing the semiconductor die for different operating conditions such as operating frequency. As a result, semiconductor dies can be manufactured in a single configuration for several different operating frequencies, and each die can be tuned to reduce (e.g. minimize) supply noise, such as by varying the ESR or the capacitance of at least one of the pathways.

17 Claims, 5 Drawing Sheets

ADAPTIVE ON DIE DECOUPLING DEVICES AND METHODS

PRIORITY APPLICATION

This application is a continuation of U.S. application Ser. No. 12/860,562, filed Aug. 20, 2010, which is incorporated herein by reference in its entirety.

TECHNICAL FIELD

Various embodiments described herein relate to semiconductor device power systems and methods.

BACKGROUND

On-die decoupling capacitance and its associated resistance are common tools for taming the characteristics of the power delivery distribution network. By selecting the resistive-capacitive combination in the power delivery system, a resonance of the system impedance can be pushed down to lower frequencies and/or pushed down in magnitude. Unfortunately, introducing effective series resistance (ESR) places a constraint on high frequency characteristics of the power delivery impedance.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and material, structural, logical, electrical changes, etc. may be made.

When selecting a resistive-capacitive combination in the power delivery system, a single choice of ESR in a decoupling system has some drawbacks. Above a resonance frequency, the ESR becomes a limiting factor. When an operating frequency is known, the decoupling scheme can sometimes be optimized to provide good noise performance for that given operating condition. Unfortunately, memory standards typically target a wide range of operating frequencies, making it difficult, if not impossible to optimize a decoupling design.

Figure 1:
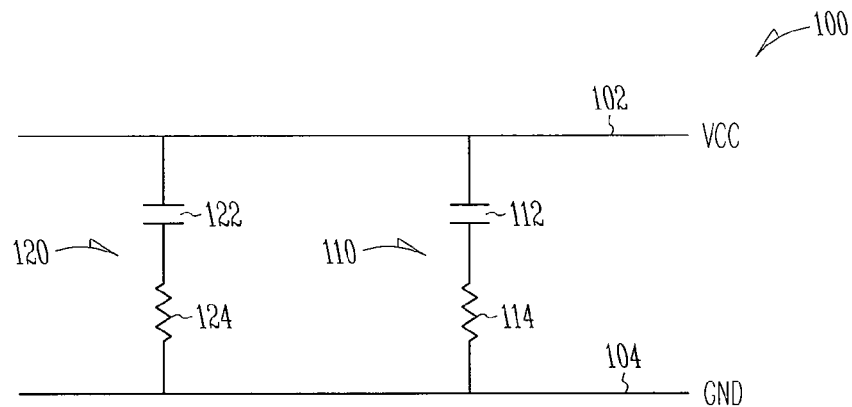
FIG. 1 shows a decoupling system according to an embodiment of the invention.

FIG. 1 shows a decoupling system 100 according to an embodiment of the invention. In one example, the decoupling system is located locally on a semiconductor die. In one example, the semiconductor die includes a memory device, such as a dynamic random access memory device or a flash memory device, etc.

A first power supply (e.g. Vcc) line 102 and a second power supply (e.g. ground) line 104 are shown. A first capacitive pathway 110 is shown having a first capacitor 112 and a first ESR 114. The first ESR is illustrated as a discrete resistor, however one of ordinary skill in the art, having the benefit of the present disclosure, will recognize that the ESR is, by definition, a sum of the resistance over the entire pathway 110 between the power supply line 102 and the second power supply line 104. Although a single capacitor 112 is illustrated, selected embodiments include one or more capacitors coupled together to provide a single capacitance value, as illustrated by capacitor 112.

A second capacitive pathway 120 is also shown. The second capacitive pathway includes a second capacitor 122 and a second ESR 124. As described above, the single element illustrations of the capacitor 122 and the ESR 124 are not intended to be limiting. Several components can be summed together and represented by the elements: second capacitor 122, and second ESR 124.

In one embodiment, the first capacitor 112 and the second capacitor 122 are fixed in capacitance value. In one embodiment, the first capacitor 112 and the second capacitor 122 have different capacitance values, one larger than the other.

In one embodiment, the first ESR 114 and the second ESR 124 have different values. In one example, the first ESR 114 has a fixed resistance value, while the second ESR 124 has an adjustable resistance. In one example, transistors are used to add and/or subtract elements from the second capacitive pathway 120 in order to adjust (e.g. vary) the resistance of the second ESR 124. In one example, the transistors are located on a semiconductor memory device, or other semiconductor die. In one example, the transistors include complementary metal oxide semiconductor (CMOS) transistors.

In one embodiment, the first capacitor 112 has a fixed capacitance value, while the second capacitor 122 has an adjustable capacitance. In one example, transistors are used to add and/or subtract capacitors from the second capacitive pathway 120 in order to vary the capacitance of the second capacitor 122. In such an example, the second capacitor 122 is made up of several capacitors that are represented as a single symbol in FIG. 1 as the second capacitor 122. In one example, the transistors are located on a semiconductor memory device, or other semiconductor die. In one example, the transistors include complementary metal oxide semiconductor (CMOS) transistors. In one embodiment, both the second capacitor 122 can have an adjustable capacitance and the second ESR 124 can have an adjustable resistance.

Figure 2:
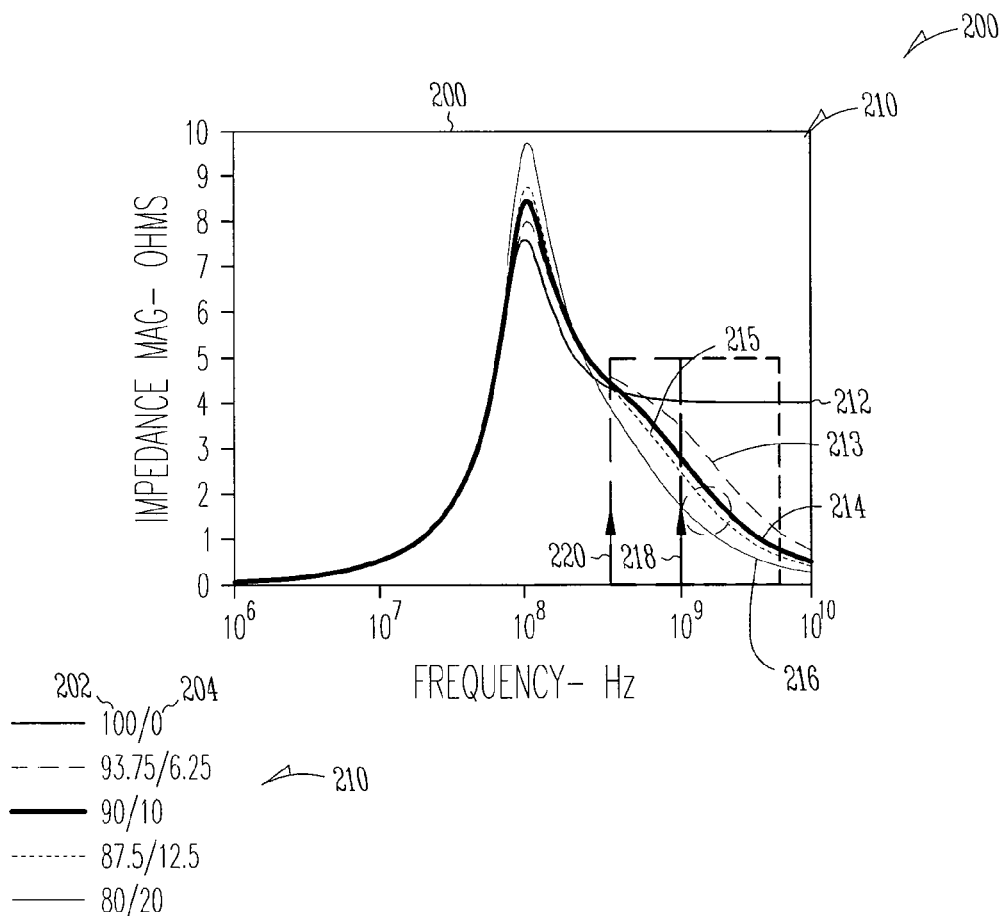
FIG. 2 shows impedance versus frequency spectra for a number of selected variations in ESR according to an embodiment of the invention.

FIG. 2 illustrates supply noise performance of a number of configurations with different combinations of capacitive pathways described above. The key 210 of FIG. 2 shows a number of combinations of first capacitive pathways 110 and second capacitive pathways 120. The first number 202 in the key is the percent of the first capacitive pathway 110, and the second number 204 is the percent of the second capacitive pathway 120. In one example, the first capacitive pathway 110 (represented by the first number in the key) includes an adjustable ESR, and the second capacitive pathway 120 (represented by the second, smaller number in the key) includes an ESR that is lower than the first capacitive pathway 110. In one example, the ESR of the second capacitive pathway 120 is as low as possible, limited only by resistive bussing, and contact resistance.

As illustrated by line 212, when only a single capacitive pathway, such as the first capacitive pathway 110 (100/0 in the key 210), is placed between the first power supply 102 and the second power supply 104, the noise performance versus power frequency is limited by the ESR of the single capacitive pathway. At frequencies above resonant frequency 206, the impedance remains limited by the resistance of the single first capacitive pathway 110.

However, when the second capacitive pathway 120 is added in various proportions, the impedance is significantly reduced above the resonant frequency 206. Line 213 illustrates 93.75 percent first capacitive pathway 110, and 6.25 percent second capacitive pathway 120. Line 214 illustrates 90 percent first capacitive pathway 110, and 10 percent second capacitive pathway 120. Line 215 illustrates 87.5 percent first capacitive pathway 110, and 12.5 percent second capacitive pathway 120. Line 216 illustrates 80 percent first capacitive pathway 110, and 20 percent second capacitive pathway 120.

At frequencies above the resonance frequency 206, the second capacitive pathway 120 provides a lower ESR value to reduce resistance, while the first capacitive pathway 110 provides a higher ESR that tends to dampen and/or eliminate resonant behaviors.

As described with respect to FIG. 1 above, in one example, the capacitance of the second capacitor 122 is varied to adjust the percentages shown in the key 210 of FIG. 2. In another example, the resistance of the second ESR 124 is varied to adjust the percentages shown in the key 210 of FIG. 2. Although varying one or both of the values (capacitance/ESR) is within the scope of the invention, only varying the resistance of the second ESR 124 can be accomplished inexpensively by subtracting or adding simple circuit elements. The expense of varying the capacitance is associated with the chip area consumed by on-die capacitance (on-die resistance can be implemented in a fairly small area). While it is possible to turn capacitance on and off, dedicating significant area to unused or disabled decoupling capacitance quickly increases the chip size, which directly increases the cost of production.

Figure 3A:
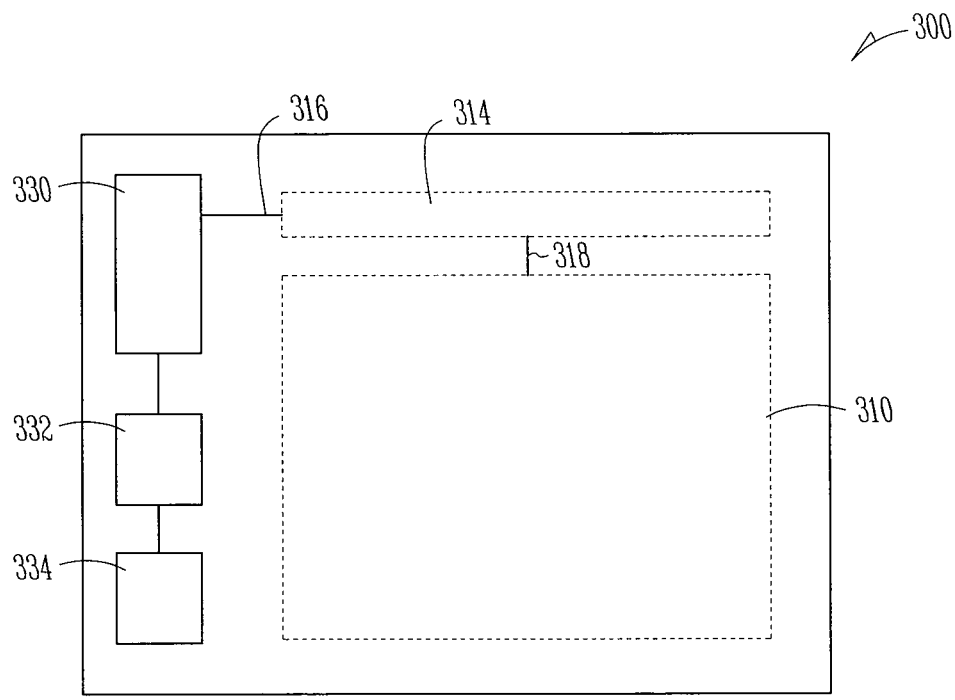
FIG. 3A shows a block diagram top view of a memory device on a semiconductor die according to an embodiment of the invention.

FIG. 3A shows a semiconductor die 300 according to an embodiment of the invention. In the example shown, the semiconductor die 300 includes a memory array 310. FIG. 3A illustrates a decoupling control circuit 330 coupled to a portion 314 of the semiconductor die 300, along connection 316 and further to the memory array 310 along connection 318. In one example two or more pathways such as a first capacitive pathway and a second capacitive pathway similar to those described in embodiments above, are included within one, or both the connection 316 and the connection 318.

In one example, the portion 314 of the semiconductor die 300 is outside of the array 310, and is used to form the two or more capacitive pathways. In another embodiment, the portion 314 includes a number of memory cells (not shown) that are used to form one or more of the two or more capacitive pathways, such as the first capacitive pathway and the second capacitive pathway as described above. For example, one or more of the pathways can be directed through memory cells in the portion 314 of the semiconductor die 300 to provide greater or lower resistance. Transistors (not shown) in the portion 314 of the semiconductor die 300 can be used to add in, or subtract a number of memory cells to increase or decrease ESR. In one example, polysilicon lines are added in, or subtracted to provide greater or lower resistance. In one example, sections of other line materials such as metal lines are added in, or subtracted to provide greater or lower resistance. In one another example, sections of lines include buried digit lines. In yet another example, sections of lines include transistor active area to increase the resistivity of the line. The different resistances of materials of different components, such as memory cells, transistors, or lines, etc. in the portion 314, can be added or subtracted to vary ESR.

In one example, a noise sensor 332 is further included in the semiconductor die 300. In one example, the noise sensor 332 is used to provide feedback to the decoupling control circuit 330 to determine a desired value of ESR in a range of available ESR values. As illustrated in FIG. 2, selecting a value of ESR for the second capacitive pathway can be used to select a desired amount of supply noise for a given operating frequency.

In one example, the noise sensor 332 includes a peak-to-peak noise sensor. In one example, the noise sensor 332 includes an accumulated noise sensor. In one example, the desired amount of supply noise is a minimum amount of supply noise for a given operating frequency, although any amount of noise can be selected.

In one example, the noise sensor 332 is used upon power up of the semiconductor die 300, and the decoupling control circuit 330 uses information provided by the noise sensor 332 to adjust the ESR of the second capacitive pathway one time upon every power up cycle of the semiconductor die 300. In one example, the noise sensor 332 and the decoupling control circuit 330 continue to function during real-time operation of the chip. In one example, the noise sensor 332 and the decoupling control circuit 330 are used only during device manufacture to set a desired ESR value. In one example, all values of ESR are swept, and the noise sensor 332 is analyzed at each ESR value to determine when the desired amount of supply noise has been met. In another embodiment, a look-up table 334 is included, and checked to select from a number of pre-determined likely values of ESR that provide low amounts of supply noise.

In one embodiment, the noise sensor 332 includes an on-die supply noise spectrum circuit. The on-die supply noise spectrum circuit provides a noise response versus frequency spectrum for a range of operating frequencies, in contrast to just a single desired operating frequency. In one embodiment, the look-up table 334 is coupled to the decoupling control circuit 330 and the noise sensor 332. In one embodiment, the noise sensor 332 includes an on-die supply noise spectrum circuit. In the example shown in FIG. 3A, the look-up table 334 is located on the semiconductor die 300.

In operation, upon power up, upon manufacture, or at some other time, the on-die supply noise spectrum circuit analyzes the spectrum for the given device configuration, and provides the spectrum to the decoupling control circuit 330. The look-up table 334 is checked to select from a number of pre-determined likely values of ESR that correspond to the spectra, and provide low amounts of supply noise for the provided spectrum. Lookup table embodiments can provide shorter analysis time to determine the best selection of ESR value. In another embodiment, the noise sensor 332 and the look-up table 334 are used to select from a number of pre-determined likely values of capacitance that correspond to the spectra, and provide low amounts of supply noise for the provided spectrum.

Figure 3B:
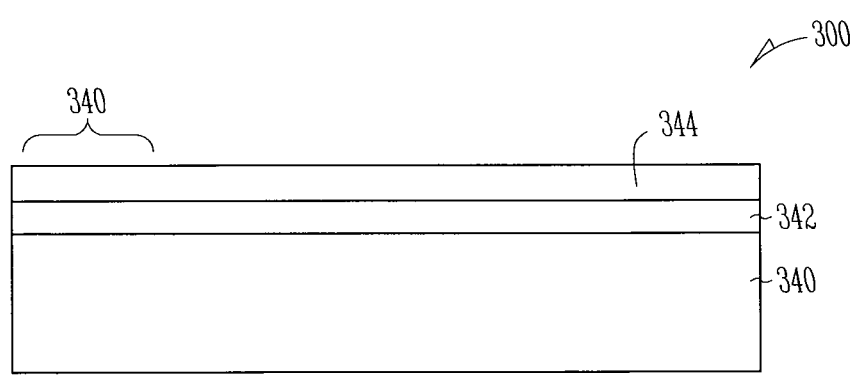
FIG. 3B shows a side view of a memory device on a semiconductor die according to an embodiment of the invention.

FIG. 3B shows a side view of the semiconductor die 300 of FIG. 3A. A base region 340 is shown with a first layer 342 and a second layer 344 formed over the base region 340. In one embodiment, semiconductor devices such as memory cells, including transistors, capacitors, etc. are formed in the base region 340. In one embodiment, the first capacitive pathway 110 is formed in the first layer 342, and the second capacitive pathway 120 is formed in the second layer 344. Using layers of the semiconductor die 300 that are formed vertically over the base region 340 enables better use of die real estate than forming all capacitive pathways on a single layer next to each other. In one example, both the first and second capacitive pathways 110 and 120 are located over one another in substantially the same lateral chip area 340.

In one example, at least one of the capacitive pathways is implemented using unused memory array cells. In one example, at least one of the capacitive pathways is implemented with a metal-oxide-semiconductor-based capacitor (MOSCAP), with a first terminal associated with the transistor gate contact and a second terminal associated with both the drain and source contacts. In one example, at least one of the capacitive pathways is implemented with a metal-insulator-metal (MIM) capacitor formed between or within on-die metallization.

Figure 4A:
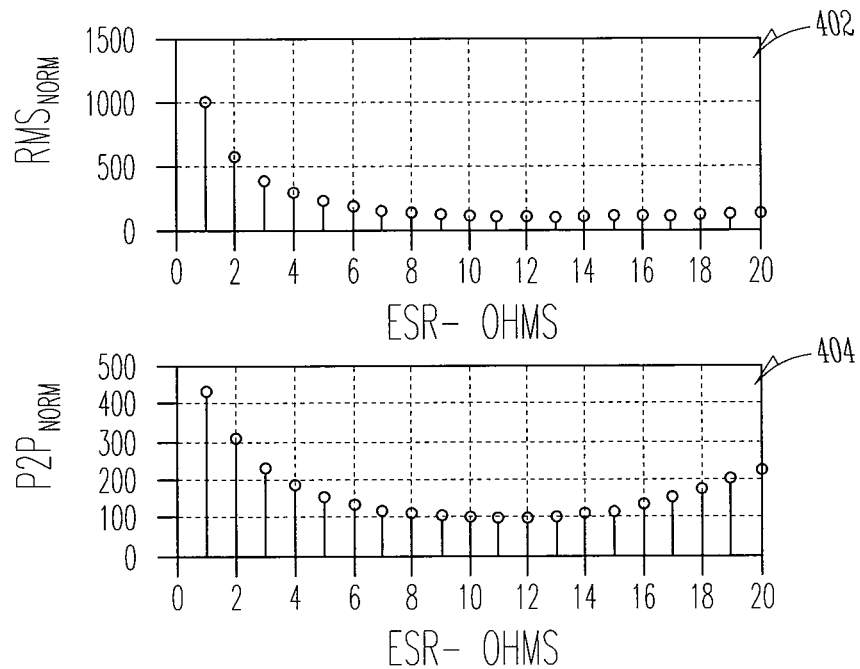
FIG. 4A shows system noise versus ESR for a first given capacitance value according to an embodiment of the invention.

FIG. 4A shows testing results of a semiconductor die configuration where inductance is fixed at 4 nH and capacitance is fixed at 50 pF. The ESR of the second capacitive pathway was swept from 1 ohm to 20 ohms. The resulting supply noise was measured using two different noise sensors. In graph 402, an accumulated noise sensor was used, and a minimum noise value was determined at 11 ohms for the adjustable ESR of the second capacitive pathway. $RMS_{norm}$ on the Y-axis of the graph indicates a root-mean-square noise value that is normalized. In graph 404, a peak-to-peak (P2P) noise sensor was used, and a minimum noise value was verified, also at 11 ohms for the adjustable ESR of the second capacitive pathway.

Figure 4B:
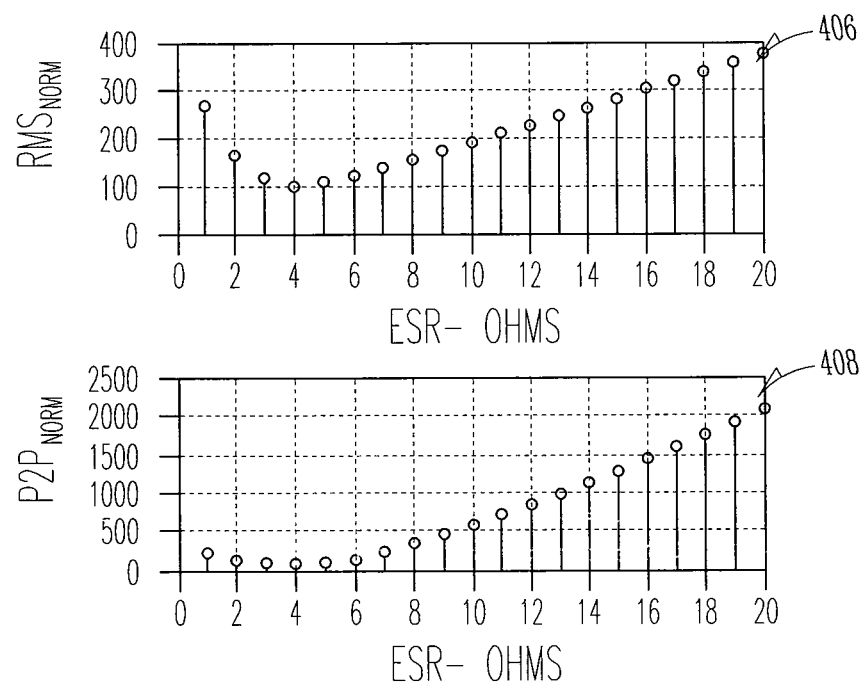
FIG. 4B shows system noise versus ESR for a second given capacitance value according to an embodiment of the invention.

FIG. 4B shows testing results of a semiconductor die configuration where inductance is fixed at 4 nH and capacitance is fixed at 400 pF. The ESR of the second capacitive pathway was again swept from 1 ohm to 20 ohms. The resulting supply noise was measured using two different noise sensors. In graph 406, an accumulated noise sensor was used, and a minimum noise value was determined at 4 ohms for the adjustable ESR of the second capacitive pathway. As in FIG. 4A, $RMS_{norm}$ on the Y-axis of the graph indicates a root-mean-square noise value that is normalized. In graph 408, a peak-to-peak (P2P) noise sensor was used, and a minimum noise value was verified, also at 4 ohms for the adjustable ESR of the second capacitive pathway.

As can be seen from FIGS. 4A and 4B, varying ESR for the second capacitive pathway provides improvements in supply noise. Semiconductor dies with a first capacitive pathway having a first ESR and a second capacitive pathway having an adjustable (e.g. tunable) ESR allow the semiconductor die to be optimized for different operating conditions such as operating frequency. As a result, semiconductor dies can be manufactured in a single configuration for several different operating frequencies, and each die can be tuned (e.g. during or after manufacturing) to reduce (e.g. minimize) supply noise by varying the ESR or the capacitance of one of the pathways.

Figure 5:
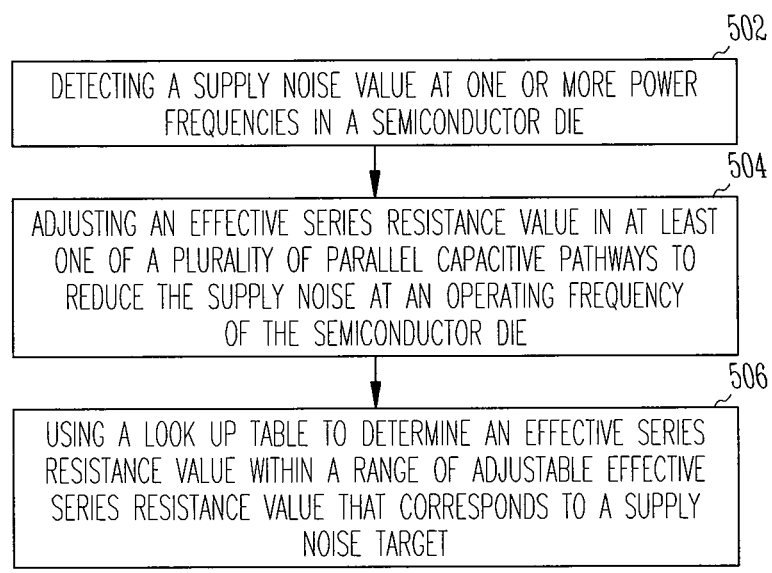
FIG. 5 shows a method of reducing supply noise according to an embodiment of the invention.

FIG. 5 shows an example method of adjusting supply noise according to an embodiment of the invention. In operation 502, a supply noise value is detected at one or more frequencies in a semiconductor die. Examples of detection of supply noise includes accumulated noise, peak-to-peak noise detection, and noise spectrum analysis, as described in embodiments above. In operation 504, an ESR value is adjusted in at least one of a plurality of parallel capacitive pathways to reduce the supply noise at an operating frequency of the semiconductor die. As described above, in one embodiment, the two or more capacitive pathways are located on the semiconductor die and coupled between a power supply and second power supply. In operation 506, a lookup table is further used to determine an ESR value within a range of adjustable ESR values that corresponds to a supply noise target.

Figure 6:
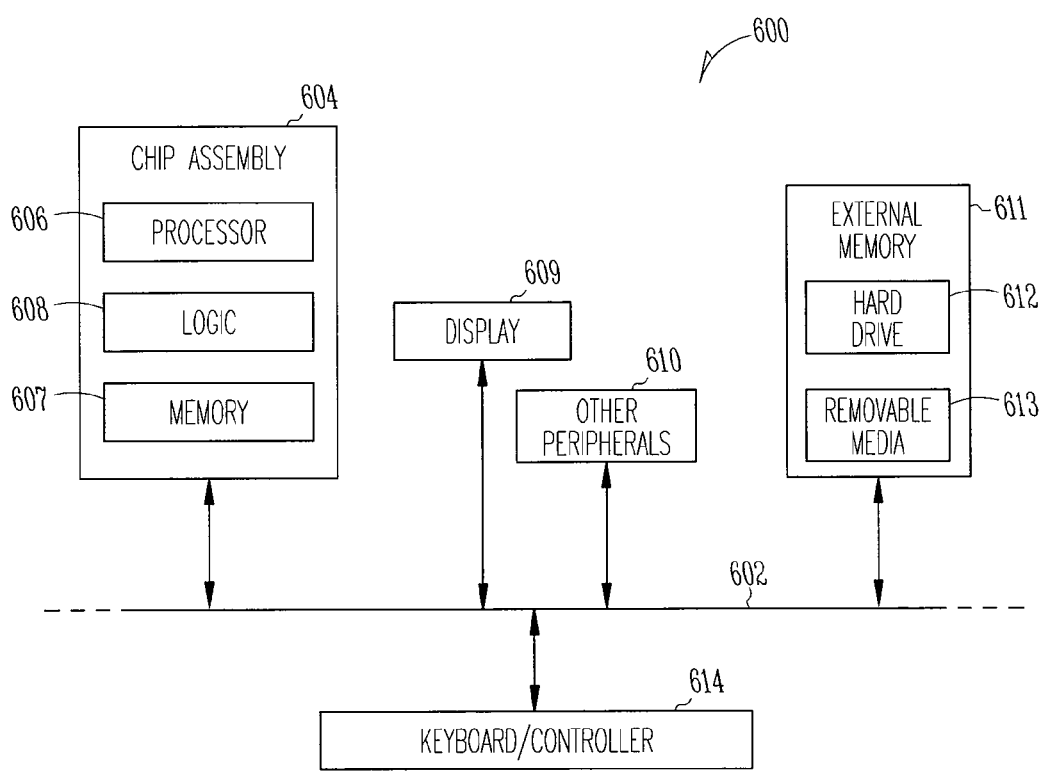
FIG. 6 shows an information handling system including a decoupling system according to an embodiment of the invention.

An embodiment of an information handling system such as a computer is included in FIG. 6 to show an embodiment of a high-level device application for the present invention. FIG. 6 is a block diagram of an information handling system 600 incorporating a decoupling system according to embodiments of the invention as described above. Information handling system 600 is merely one embodiment of an electronic system in which decoupling systems of the present invention can be used. Other examples include, but are not limited to, netbooks, cameras, personal data assistants (PDAs), cellular telephones, MP3 players, aircraft, satellites, military vehicles, etc.

In this example, information handling system 600 comprises a data processing system that includes a system bus 602 to couple the various components of the system. System bus 602 provides communications links among the various components of the information handling system 600 and may be implemented as a single bus, as a combination of busses, or in any other suitable manner.

Chip assembly 604 is coupled to the system bus 602. Chip assembly 604 may include any circuit or operably compatible combination of circuits. In one embodiment, chip assembly 604 includes a processor 606 that can be of any type. As used herein, "processor" means any type of computational circuit such as, but not limited to, a microprocessor, a microcontroller, a graphics processor, a digital signal processor (DSP), or any other type of processor or processing circuit.

In one embodiment, a memory chip 607 is included in the chip assembly 604. In one embodiment, the memory chip 607 includes a decoupling system as described in embodiments above.

In one embodiment, additional logic chips 608 other than processor chips are included in the chip assembly 604. An example of a logic chip 608 other than a processor includes an analog to digital converter. Other circuits on logic chips 608 such as custom circuits, an application-specific integrated circuit (ASIC), etc. are also included in one embodiment of the invention.

Information handling system 600 may also include an external memory 611, which in turn can include one or more memory elements suitable to the particular application, such as one or more hard drives 612, and/or one or more drives that handle removable media 613 such as compact disks (CDs), flash drives, digital video disks (DVDs), and the like. A semiconductor memory die constructed as described in examples above is included in the information handling system 600.

Information handling system 600 may also include a display device 609 such as a monitor, additional peripheral components 610, such as speakers, etc. and a keyboard and/or controller 614, which can include a mouse, trackball, game controller, voice-recognition device, or any other device that permits a system user to input information into and receive information from the information handling system 600.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. An electronic system, comprising:
   a semiconductor memory connected to a processor;
   a connection between power and the semiconductor memory, including:
   a first capacitive pathway, comprising a first effective series resistance, between a first power supply and a second power supply, the first capacitive pathway being located on a semiconductor die;
   a second capacitive pathway, comprising a second effective series resistance, the second capacitive pathway coupled in parallel with the first capacitive pathway between the first power supply and the second power supply, wherein the second effective series resistance is adjustable.

2. The electronic system of claim 1, wherein a capacitance of the second capacitive pathway is adjustable.

3. The electronic system of claim 1, further comprising a third capacitive pathway, the third capacitive pathway comprising a third effective series resistance, the third capacitive pathway coupled in parallel with the first and second capacitive pathways between the first power supply and the second power supply, and wherein the third effective resistance is adjustable.

4. The electronic system of claim 1, further comprising a control circuit, configured to adjust the second effective series resistance to select a desired amount of supply noise for a given operating frequency.

5. The electronic system of claim 1, further comprising a control circuit, configured to adjust the second effective series resistance to select a desired amount of supply noise for a given operating frequency.

6. The electronic system of claim 5, further comprising a noise sensor, wherein the noise sensor and the control circuit are configured to determine a desired effective series resistance value that corresponds to the desired amount of supply noise.

7. An electronic system, comprising:
   a semiconductor memory connected to a processor;
   a connection between power and the semiconductor memory, including:
   a first capacitive pathway, comprising a first effective series resistance, between a first power supply and a second power supply, the first capacitive pathway being located on a semiconductor die;
   a metal-oxide-semiconductor (MOSCAP) based capacitive pathway, comprising a second effective series resistance, the second capacitive pathway coupled in parallel with the first capacitive pathway between the first power supply and the second power supply, wherein the second effective series resistance is adjustable.

8. The electronic system of claim 7, wherein the second capacitive pathway provides a capacitance of approximately 50 pF.

9. The electronic system of claim 8, wherein the second effective series resistance is adjusted to approximately 11 ohms.

10. The electronic system of claim 7, wherein the second capacitive pathway provides a capacitance of approximately 400 pF.

11. The electronic system of claim 10, wherein the second effective series resistance is adjusted to approximately 11 ohms.

12. An electronic system, comprising:
    a semiconductor memory connected to a processor;
    a connection between power and the semiconductor memory, including:
    a first capacitive pathway, comprising a first effective series resistance, between a first power supply and a second power supply, the first capacitive pathway being located on a semiconductor die;
    a metal-insulator-metal (MIM) based capacitive pathway, comprising a second effective series resistance, the second capacitive pathway coupled in parallel with the first capacitive pathway between the first power supply and the second power supply, wherein the second effective series resistance is adjustable.

13. The electronic system of claim 12, further comprising a control circuit, configured to adjust the second effective series resistance to select a desired amount of supply noise for a given operating frequency.

14. The electronic system of claim 12, wherein the second capacitive pathway provides a capacitance of approximately 50 pF.

15. The electronic system of claim 14, wherein the second effective series resistance is adjusted to approximately 11 ohms.

16. The electronic system of claim 12, wherein the second capacitive pathway provides a capacitance of approximately 400 pF.

17. The electronic system of claim 16, wherein the second effective series resistance is adjusted to approximately 11 ohms.

* * * * *